(12) United States Patent
Havens et al.

(10) Patent No.: US 8,317,104 B2
(45) Date of Patent: Nov. 27, 2012

(54) IMAGE ENGINE WITH INTEGRATED CIRCUIT STRUCTURE FOR INDICIA READING TERMINAL

(75) Inventors: William H. Havens, Syracuse, NY (US);
Ynjiun P. Wang, Cupertino, CA (US);
Edward C. Bremer, Victor, NY (US);
Kevin D. Bower, Syracuse, NY (US)

(73) Assignee: Hand Held Products, Inc., Skaneateles Falls, NY (US)

( * ) Notice: Subject to any disclaimer, the term of this patent is extended or adjusted under 35 U.S.C. 154(b) by 137 days.

(21) Appl. No.: 12/851,186

(22) Filed: Aug. 5, 2010

(65) Prior Publication Data
US 2012/0031977 A1 Feb. 9, 2012

(51) Int. Cl.
*G06K 7/14* (2006.01)
(52) U.S. Cl. ...................................................... 235/454
(58) Field of Classification Search .................. 235/454, 235/472.01–472.03, 462.01
See application file for complete search history.

(56) References Cited

U.S. PATENT DOCUMENTS

| | | | |
|---|---|---|---|
| 5,319,182 A | 6/1994 | Havens et al. | |
| 5,479,000 A | 12/1995 | Dvorkis et al. | |
| 5,525,810 A | 6/1996 | Jewell et al. | |
| 5,550,363 A | 8/1996 | Obata | |
| 5,589,679 A | 12/1996 | Dvorkis et al. | |
| 5,625,483 A | 4/1997 | Swartz | |
| 5,629,990 A | 5/1997 | Tsuji et al. | |
| 5,682,029 A | 10/1997 | Dvorkis et al. | |
| 5,698,835 A | 12/1997 | Dvorkis et al. | |
| 5,714,746 A | 2/1998 | Dvorkis et al. | |
| 5,784,102 A * | 7/1998 | Hussey et al. | 348/296 |
| 5,796,869 A | 8/1998 | Tsuji et al. | |
| 5,814,827 A * | 9/1998 | Katz | 250/556 |
| 5,900,617 A | 5/1999 | Dvorkis et al. | |
| 5,902,989 A | 5/1999 | Metlitsky et al. | |
| 5,914,480 A | 6/1999 | Swartz | |
| 6,021,947 A | 2/2000 | Swartz | |
| 6,050,491 A | 4/2000 | Shepard et al. | |
| 6,056,200 A | 5/2000 | Dvorkis et al. | |
| 6,060,722 A | 5/2000 | Havens et al. | |
| 6,065,678 A | 5/2000 | Li et al. | |
| 6,073,848 A | 6/2000 | Giebel | |
| 6,102,294 A | 8/2000 | Swartz et al. | |

(Continued)

FOREIGN PATENT DOCUMENTS
EP 1041628 A2 10/2000

OTHER PUBLICATIONS

Dec. 15, 2011 European Search Report in European Application No. 11175880.1.

(Continued)

*Primary Examiner* — Seung Lee
(74) *Attorney, Agent, or Firm* — Heslin Rothenberg Farley & Mesiti P.C.

(57) ABSTRACT

Embodiments of the present invention comprise an image engine constructed as an IC structure that has one or more active regions for illuminating, imaging, and decoding a decodable indicia. In one embodiment of the image engine, the IC structure can comprise an imaging region, an aiming region, and an illumination region, all disposed on a single, contiguous substrate. The resultant constructed embodiment can fit within a form factor, wherein the form factor is less than about 500 $mm^3$.

19 Claims, 12 Drawing Sheets

U.S. PATENT DOCUMENTS

| | | | |
|---|---|---|---|
| 6,119,939 A | 9/2000 | Schwartz et al. | |
| 6,152,368 A | 11/2000 | Olmstead et al. | |
| 6,155,488 A | 12/2000 | Olmstead et al. | |
| 6,173,894 B1 | 1/2001 | Olmstead et al. | |
| 6,176,429 B1 | 1/2001 | Reddersen et al. | |
| 6,230,975 B1 | 5/2001 | Colley et al. | |
| 6,256,016 B1 | 7/2001 | Piot et al. | |
| 6,276,605 B1 | 8/2001 | Olmstead et al. | |
| 6,299,066 B1 | 10/2001 | Howland et al. | |
| 6,311,895 B1 | 11/2001 | Olmstead et al. | |
| 6,340,114 B1 * | 1/2002 | Correa et al. | 235/462.22 |
| 6,507,708 B2 | 1/2003 | Kanda | |
| 6,601,768 B2 | 8/2003 | McCall et al. | |
| 6,607,128 B1 | 8/2003 | Schwartz et al. | |
| 7,044,377 B2 | 5/2006 | Patel et al. | |
| 7,055,747 B2 | 6/2006 | Havens et al. | |
| 7,090,132 B2 | 8/2006 | Havens et al. | |
| 7,219,843 B2 | 5/2007 | Havens et al. | |
| 7,268,335 B2 | 9/2007 | Hiltunen | |
| 7,270,274 B2 | 9/2007 | Hennick et al. | |
| 7,389,929 B2 | 6/2008 | Havens et al. | |
| 7,504,665 B2 | 3/2009 | Summers | |
| 7,581,680 B2 | 9/2009 | Knowles et al. | |
| 7,584,892 B2 | 9/2009 | Knowles et al. | |
| 2001/0003346 A1 * | 6/2001 | Feng | 235/472.01 |
| 2003/0080188 A1 | 5/2003 | Carlson et al. | |
| 2005/0056699 A1 | 3/2005 | Meier et al. | |
| 2008/0220563 A1 | 9/2008 | Karnezos | |
| 2009/0153729 A1 | 6/2009 | Hiltunen et al. | |
| 2009/0194668 A1 | 8/2009 | Kong | |

OTHER PUBLICATIONS

Dec. 27, 2011 Communication pursuant to Article 94(3) EPC in European Application No. 11175880.1.

* cited by examiner

A - A

C - C

IMAGE ENGINE WITH INTEGRATED CIRCUIT STRUCTURE FOR INDICIA READING TERMINAL

FIELD OF THE INVENTION

The present invention relates to indicia reading terminals, and more particularly, to embodiments of an integrated circuit device for imaging decodable indicia with an indicia reading terminal.

BACKGROUND OF THE INVENTION

Indicia reading terminals are available in multiple varieties. Well-known among the varieties is the gun style terminals as commonly seen at retail store checkout counters. Other terminals are also available that provide enhanced functions, have keyboards, and displays, and include advanced networking communications capabilities.

Among the many functions of these indicia reading devices is the capability to image decodable indicia. Compared to scanning such indicia, which is commonly done with laser scanners designed to raster laser light across the indicia, image capable terminals utilize imaging technology that can capture, store, and process image data of the decodable indicia. The terminal is able to render from the captured image data the information stored in the decodable indicia.

The terminals of this type, however, that utilize image sensors can have functional limitations that do no permit them to fully address the requirements that can be critical to certain indicia reading applications. To address such problems, complicated technology that comprises movable lens assemblies, multiple lens assemblies, and additional image sensors and related circuitry can be used to, e.g., increase the depth of field and resolution of the indicia reading terminal. These solutions often exceed the size, and cost constraints that are necessary to implement image sensors in the wide range of devices that are used as the indicia reading terminals.

Therefore, there is a recognized need for an imaging device that can decode decodable indicia, but that fits with certain physical limitations.

SUMMARY OF THE INVENTION

As discussed in more detail below, there is provided embodiments of an integrated circuit package that comprises an image engine equipped to illuminate, image, and decode decodable indicia. The integrated circuit package is operatively constructed so as to have a form factor that is small, with features and concepts that are integrated on the wafer-level scale so as to reduce assembly issues, as well as the cost of the image engine.

Further discussion of these and other features is provided below in connection with one or more embodiments, examples of which may be described in the following:

In one embodiment, an integrated circuit package for imaging decodable indicia on a target. The integrated circuit package comprises a first substrate comprising integrated circuitry having a single input/output for conducting control and output signals. The integrated circuit package also comprises a second substrate coupled to the first substrate to conduct at least one output to the single input/output. The integrated circuit package further comprises a camera module integrated with the second substrate, the camera module comprising an image sensor die and an integrated lens assembly through which light reflected from the target passes to the image sensor die. The integrated circuit package yet further comprises an illumination module coupled to the first substrate, the illumination module comprising a first light source for directing a first light beam in the direction of the target.

In another embodiment, a semiconductor chip package for use in a hand held indicia reading terminal for imaging decodable indicia on a target. The semiconductor chip package comprises a substrate comprising at least a first layer and a second layer, the first layer having a ball grid array disposed thereon and forming a first input/output. In one example of the semiconductor chip package, the first layer comprises an illumination region that generates a first light beam in the direction of the target. In another example of the semiconductor chip package the second layer comprises an imaging region that comprises an image sensor die with an integrated lens assembly through which light reflected from the target passes to the image sensor die. In yet another example of the semiconductor chip package the second layer has a second input/output coupled to the first layer in operative configuration to conduct an output from the image sensor die to the first input/output via the first layer.

In yet another embodiment, a hand held indicia reading terminal for imaging decodable indicia on a target. The hand held indicia reading terminal comprises an integrated circuit package for imaging the decodable indicia and a hand held housing in surrounding relation to the integrated circuit package. In one example of the hand held indicia reading terminal the integrated circuit package comprises a first substrate that comprises a single input/output for conducting control and output signals and a camera module. The camera module comprises a second substrate coupled to the first substrate, a image sensor die disposed on the second substrate and which is responsive to light reflected from the target, and an integrated lens assembly through which light reflected from the target passes to the image sensor die. In another example of the hand held indicia reading terminal the hand held housing is operatively configured to operate the integrated circuit package via the single input/output so as to decode the decodable indicia.

BRIEF DESCRIPTION OF THE DRAWINGS

So that the manner in which the above recited features of the present invention can be understood in detail, a more particular description of the invention briefly summarized above, may be had by reference to the embodiments, some of which are illustrated in the accompanying drawings. It is to be noted, however, that the appended drawings illustrate only typical embodiments of this invention and are therefore not to be considered limiting of its scope, for the invention may admit to other equally effective embodiments. Moreover, the drawings are not necessarily to scale, emphasis generally being placed upon illustrating the principles of certain embodiments of invention.

Thus, for further understanding of the concepts of the invention, reference can be made to the following detailed description, read in connection with the drawings in which.

DETAILED DESCRIPTION OF THE INVENTION

Figure 1:
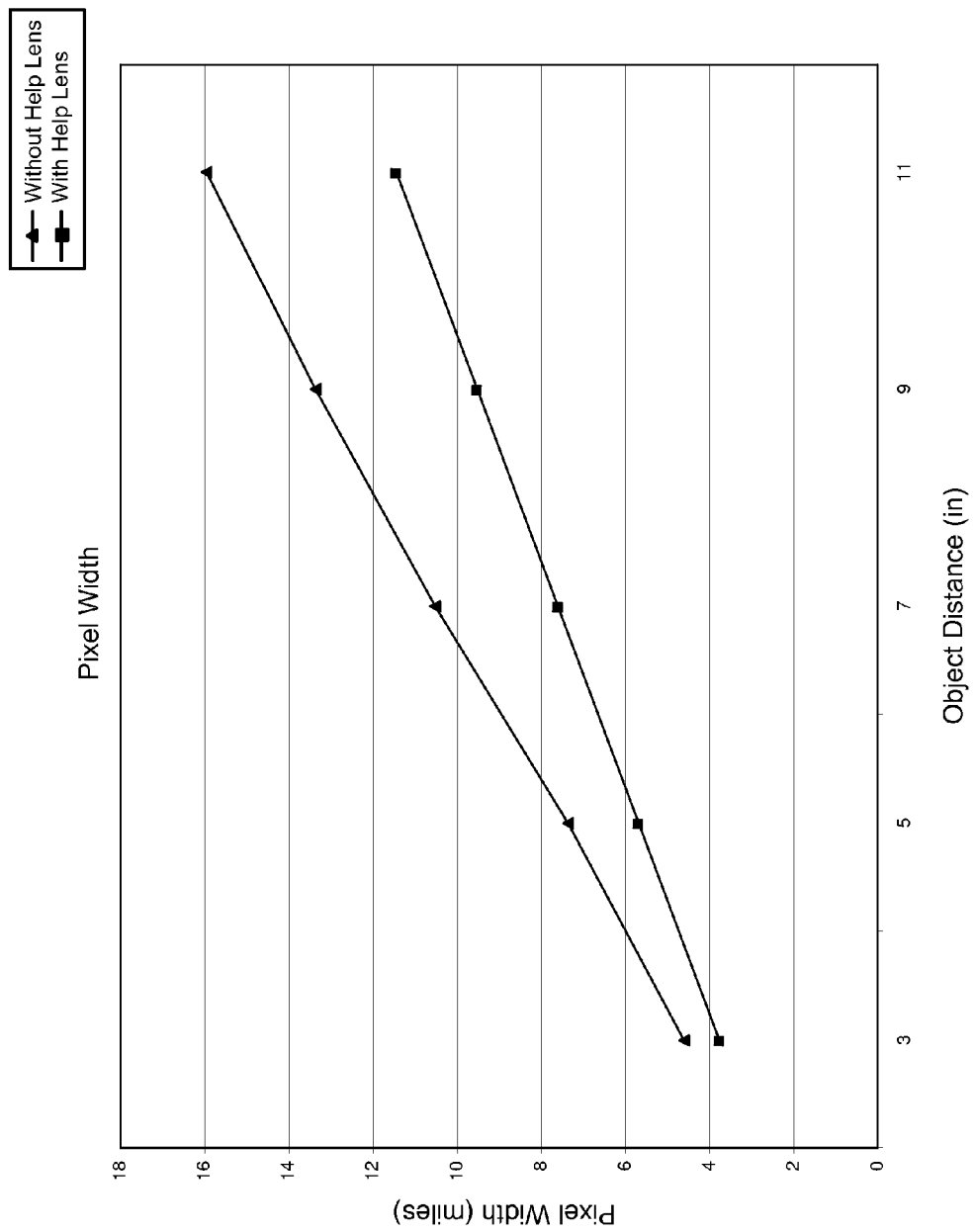
FIG. 1 is a plot of the effective pixel width in the paper plane as a function of distance from the imager with an without the use of a help lens.

While detailed examples of devices that are made in accordance with the concepts of the present invention can be had with reference to the FIGS. 1-12 below, broadly stated there is provided embodiments of an integrated circuit ("IC") package constructed as an image engine for imaging decodable indicia on a target. These image engines can comprise an imaging module, an aiming pattern generating module, and an illumination module developed as part of the IC package such as by utilizing wafer-level, wafer-scale, chip-scale, and package-on-package manufacturing techniques. With the substantial size reductions made possible with architecture designed and manufactured in accordance with such techniques, the resultant image engine can provide the functionality necessary to illuminate, image, and decode the decodable indicia using components and circuitry that can fit within a form factor that can be substantially less than the form factor of other, larger devices that provide similar functionality.

Examples of the IC package discussed in more detail below can have a form factor, for example, of less than about 300 mm³, with particular embodiments being constructed in such a manner that the form factor is less than about 150 mm³. This size is beneficial because image engines of such small form factors are widely applicable and can be installed for example in gun style reader housings, personal data assistants ("PDAs"), portable data terminals ("PDTs"), mobile telephones, calculators, wrist watches, finger worn "ring scanners," writing implements such as pens, and numerous other scanning-ready devices. Moreover, in addition to the benefit of such varied application, the image engines of the type disclosed and described herein can also be produced at costs that are substantially less than the costs typically associated with devices of similar functionality that utilize discrete components, non-continuous substrates, and other "large scale" manufacturing processes and techniques.

According to one concept of the present invention the image module in embodiments of the image engine can comprise a camera with an image sensor for capturing image data including image data consistent with the decodable indicia. Particular examples of cameras of the type used in the image module are provided further below. It is contemplated that cameras considered to be video graphics array ("VGA") cameras, as well as megapixel cameras are suitable for implementation in the image module. The camera module can be constructed using wafer scale manufacturing and integration techniques that offer small form factor and low cost devices. Such devices can be compatible with similar wafer-level, and package-on-package construction techniques that are used to generate IC packages.

The image module can also comprise a lens module with one or more help lenses for focusing light reflected e.g., by the decodable indicia, onto the image sensor. The help lens can be designed to intercept the reflected light such as by being deposited as a layer of material or other operative device with physical and/or optical properties that improve the ability of the image module to decode the decodable indicia. Examples of such physical and optical properties include material properties (e.g., index of refraction), material thickness, curvature, focal length, conic constants, and element separation, among many others.

Implementation of the help lens may be necessary, for example, in order to properly read a bar code (or other decodable indicia). The help lens may be beneficial (i) to provide adequate signal strength; (ii) to cause the pixel separation to be less than the minimum bar/space element size of the imaged indicia as seen by the imager; (iii) to cause the lens/imager combination square wave bar-space modulation at the maximum spatial frequency associated with the bar code being read to be greater than approximately 20%; and (iv) to appropriately fit the image of the bar code pattern within the imager field of view.

In another embodiment, the near and/or far scanning distances can be modified (e.g., limited and/or improved) by changing any one or all of the attributes that characterize the lens, the imager, and the terminal in general. In one example, the camera and similar commercially available imager lens assemblies may include an integrated optical system that utilizes a very short focal length lens system. Utilization of this system can result in a very low spatial sampling rate, even for short reading distances between the decodable indicia and the terminal. In such systems the focal length of the lens system can be approximately 1.5 mm with the focus of the system at infinity. A consequence of these features of the lens system is that at about 5 inches from the imager the spatial sampling in indicia space was 7.4 mils (0.0074 inch). This spatial sampling value would effectively preclude scanning any decodable indicia with a minimum indicia/space element size smaller than about 7.5 mils (0.0075 inch). In many market situations, however, it may be desirable to read decodable indicia with a minimum indicia/element size of as small as 6 mils (0.006 inch). This can not be achieved with the commercially-available optical configuration discussed above.

In accordance with the concepts of the invention disclosed herein, one embodiment of the image engine can comprise a lens system and/or imaging system that positions the help lens proximate to, and in at least one construction in front of, the lens system such as the lens system of the commercially available lens system described above. In one embodiment, the help lens can comprise a lens with a focal length of 41 mm at a location of 13.8 mm in front of the imaging module. In one example, this configuration of the help lens can allow a spatial sampling of about 5.7 mils. In another example, this configuration can achieve operating distances shown in Table 1 below.

TABLE 1

| | Depth of Field | | |
| --- | --- | --- | --- |
| | Min-x (in) | Min Scan (in) | Max Scan (in) |
| Help Lens | 5 | 3 | 4 |
| | 8 | 3 | 5 |
| | 10 | 3 | 8 |
| No Help Lens | 10 | 3 | 5 |
| | 13 | 3 | 8 |
| | 20 | 3 | 13 |

Figure 2:
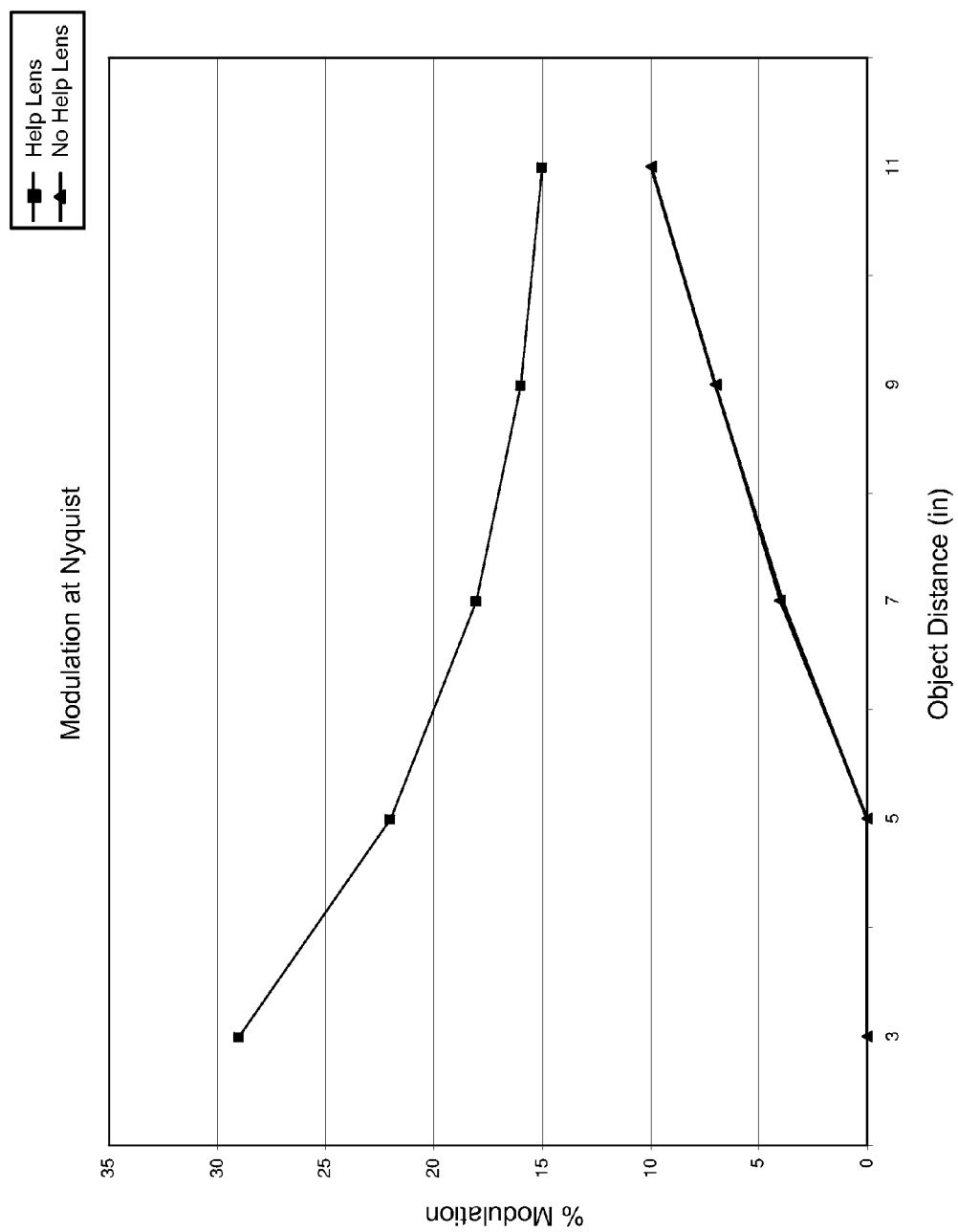
FIG. 2 is a plot of image sine wave modulation at the Nyquist frequency as a function of distance form the imager with and without the use of a help lens.
Figure 3:
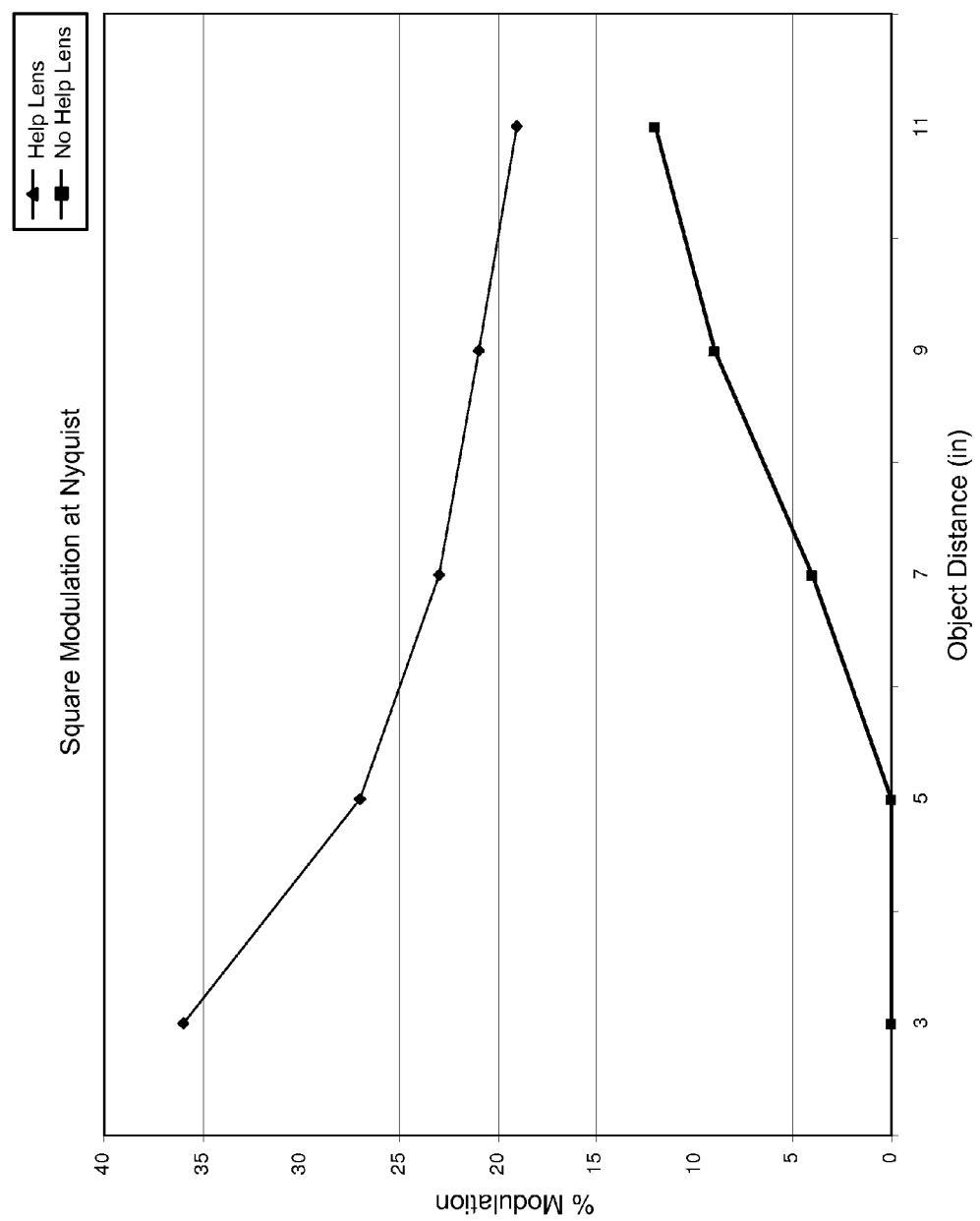
FIG. 3 is a plot of image square wave modulation at the Nyquist frequency as a function of distance from the imager with and without the use of a help lens.

Improvements indicative of the help lens and related concepts when implemented in another embodiment of the image engine is illustrated by way of data plotted in the plots of FIGS. 1-3. In this embodiment, there is depicted data that illustrates configurations of the image engine with the help lens that can be used in conjunction with the camera so as to improve imaging characteristics of the image module. Comparative date of a similar camera without the help lens is provided to illustrate the improvement in the characteristics of the image engine. This data in FIGS. 1 and 2 was modeled based on a VGA camera having a pixel width of 2.25 μm, and an imager width of 640 pixels. The data is for a barcode having a width of 1.23 in. The imager pixel size corresponds to an imager Nyquist frequency of 222 cycles/mm.

Conventional techniques may achieve adequate signal level by adjusting the imager integration time and or the illumination level appropriately, but this adjustment may not be feasible if, for example, the separation between bar code and the terminal is too large. To counteract large separation distances, the spatial sampling can be modified by appropriately adjusting the optical system magnification through lens design and/or location of the bar code pattern in the depth of field. The lens design can affect the optical square wave bar-space modulation, which may be reduced when the bar code pattern is out of focus at either the near or far scanning positions. In one embodiment, if the bar code image over fills the imager, either the imager size can be increased or the magnification can be changed appropriately by changing the lens design and/or the separation between the bar code and the lens.

According to another concept of the present invention provided below, embodiments of the image engine can comprise a single, continuous substrate on which are disposed the various systems and components. This substrate can have a single input/output such as a ball grid array, which can interface with corresponding conductive terminals such as those found in a socket or other receptacle in, e.g., the hand held data terminal or in some instances being soldered directly to the system printed circuit board ("PCB"). The image engine can be likewise operatively configured and constructed with groups of electrical circuits that are each configured to operate, separately or in conjunction with other electrical circuits, to illuminate, image, and decode the decodable indicia. The electrical circuits that are used to implement the concepts of the present invention can be constructed in a manner that interconnect a variety of electrical elements such as, but not limited to, resistors, capacitors, transistors, switches, gates, diodes including light emitting diodes ("LEDs") and laser diodes, and other logic circuit components. They may further communicate with other circuits (and/or devices), which execute high-level logic functions, algorithms, as well as process firmware, and software instructions. Exemplary circuits of this type include, but are not limited to, microprocessors such as a CPU, memory such as random access memory ("RAM"), field programmable gate arrays ("FPGAs"), and application specific integrated circuits ("ASICs"). While all of these elements, circuits, and devices function individually in a manner that is generally understood by those artisans that have ordinary skill in the semiconductor arts, it is their combination and integration into functional groups and circuits on the single, continuous substrate that generally provides for the concepts of the present invention that are disclosed and described herein.

In one embodiment, the substrate can be a semiconductor structure suitable for the growth and deposition of material layers, which can form, in whole or in part, the components and/or the structures mentioned generally above and described in more detail below. These material layers can be used in one or more of the imaging module, the aiming pattern generating module, and the illumination module. These material layers can be grown sequentially on the substrate according to, e.g., epitaxy techniques, known in the art, although many other suitable deposition techniques could be used as well, such as chemical vapor deposition. In another embodiment, the substrate can have material layers on which can be received, and otherwise secured to the surface of the materials layers individual, discrete components and structures such as, for example, an image sensor constructed of a charge couple device ("CCD") or complementary metal oxide device ("CMOS"). The substrate may comprise circuitry that couples the imager to a ball grid array so as to permit signals from the imager, such as signals indicative of image data from the decodable indicia, to be transmitted to other portions of the image engine, e.g., via other circuitry of the substrate.

Another concept of the present invention that is illustrated in one or more of the examples below is that the embodiments of the image engine can be operatively configured to optically isolate the imaging module from the light sources, e.g., the aiming pattern generating module and the illumination module. This isolation is beneficial because the form factor of the image engine places in close proximity the light sources and the imaging module so as to increase the likelihood that light can disrupt or interfere with the decoding and imaging functions of the image engine. Image engines provided herein, however, can substantially prevent light, including stray light from these light sources from impinging on, e.g., the image sensor (either CMOS or CCD). For example, these image engines can comprise optically opaque elements, and structures that surround the imaging module, but that do not limit the functionality of the image sensor (or the image engine generally) to illuminate, image, and decode the decodable indicia. In one embodiment, the image engine can comprise a shroud that separates the imaging module from the light sources. In another embodiment, the imaging engine can comprise a material layer that is disposed on at least a portion of the image engine so as to shield the imaging module from the light sources.

Yet another concept of the present invention is that there is provided embodiments of the image engine that can comprise one or more lens layers constructed of materials with optical properties for modifying light reflected from the target. These lens layers can be disposed or otherwise deposited so as to receive the reflected light before the imaging module, and particularly before the image sensor. This arrangement permits the adjustment of the focal properties of the imaging module, which is beneficial because the imaging modules incorporated in some embodiments can have fixed focal properties that are not well-suited for imaging decodable indicia on a target placed in close proximity to the imager. The lens layers, on the other hand, can be implemented in a manner that improves, and/or augments the focal properties of the image sensor so as to, e.g., increase the depth of field of the image engine (and/or the scanner module). In one example, the imaging engine can have a fixed depth of field, and the lens layers can have one or more layers of material that increase the fixed depth of field.

Figure 4:
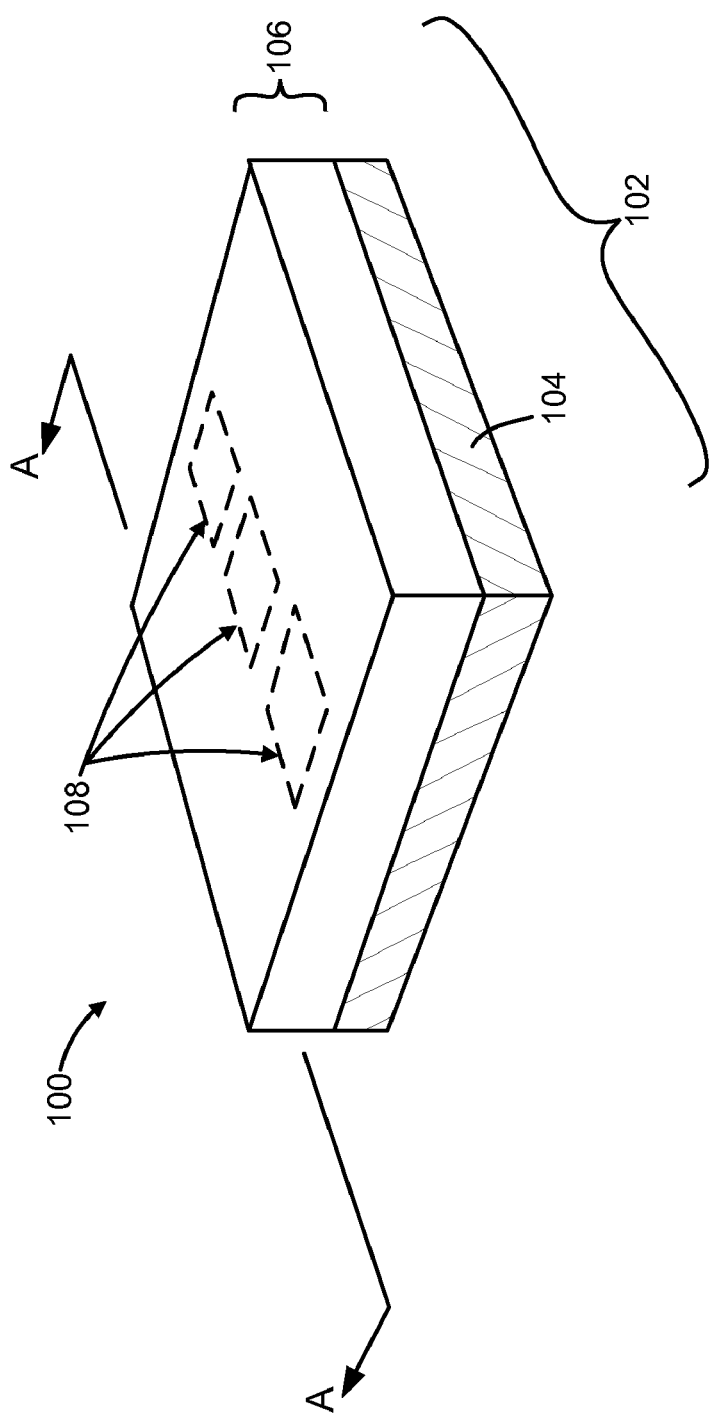
FIG. 4 is a high level perspective view of an example of an image engine that is made in accordance with the concepts of the present invention.
Figure 5:
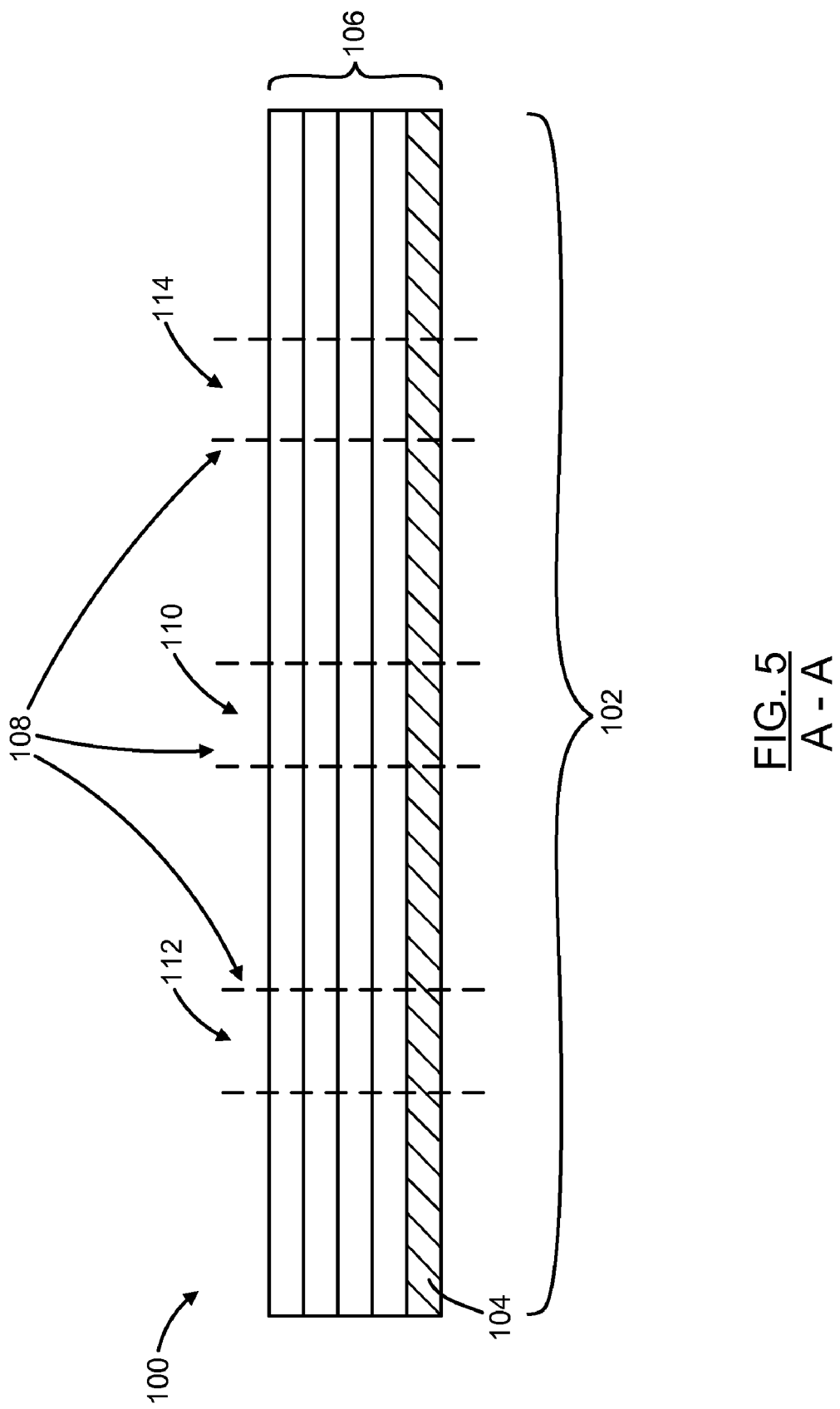
FIG. 5 is a front, cross-section view of the image engine of FIG. 4.

These concepts as well as other features of the present invention may be embodied in the example of the image engine 100 that is illustrated in the schematic diagram of FIGS. 4 and 5 below. The image engine 100 can comprise an IC structure 102 that can comprise a substrate layer 104 such as silicon, or other semi-insulating crystal material, on which is disposed a multiple layer structure 106 of semiconductor materials (e.g., gallium arsenide (GaAs) or silicon and alternately the individual system elements might be placed on a ceramic substrate. The substrate layer may also be of a fiberglass PCB material or other equivalent substrate materials suitable for supporting and interconnecting the required active regions. Exemplary materials can comprise porcelain on steel. This multiple layer structure 106 can be constructed using one or more of the manufacturing techniques and processes for manipulating the semiconductor materials to form a plurality of active regions 108. These active regions 108 can be operatively configured so as to function within the IC structure 102 to illuminate, image, and decode the decodable indicia on a target. In one embodiment, the active regions 108 can comprise an imaging region 110, an aiming region 112, and an illumination region 114. Each of these regions can be constructed of alternating layers of the semiconductor material so as to form electrical circuits, discrete devices, and/or receptacle areas for receiving discrete devices of the types described herein. Suitable electrical circuits and devices can operate, under for example electrical stimulation, to perform one or more functions, e.g., generating light, imaging reflected light, and decoding the indicia. In other embodiments, a single illumination system may be used and illumination region 114 may be absent, or in other constructions may have alternate functionality such as a microprocessor and memory functionality. In still other embodiments, the aimer functionality as indicated by incorporation of the aiming region 112 may not be required or necessitated and is can therefore be absent.

Further discussion of some of the electrical circuits and devices that can be constructed as part of each of the imaging region 110, the aiming region 112, and the illumination region 114 are provided below in the form of examples of image engines that incorporate one or more of the concepts of the present invention.

Figure 6:
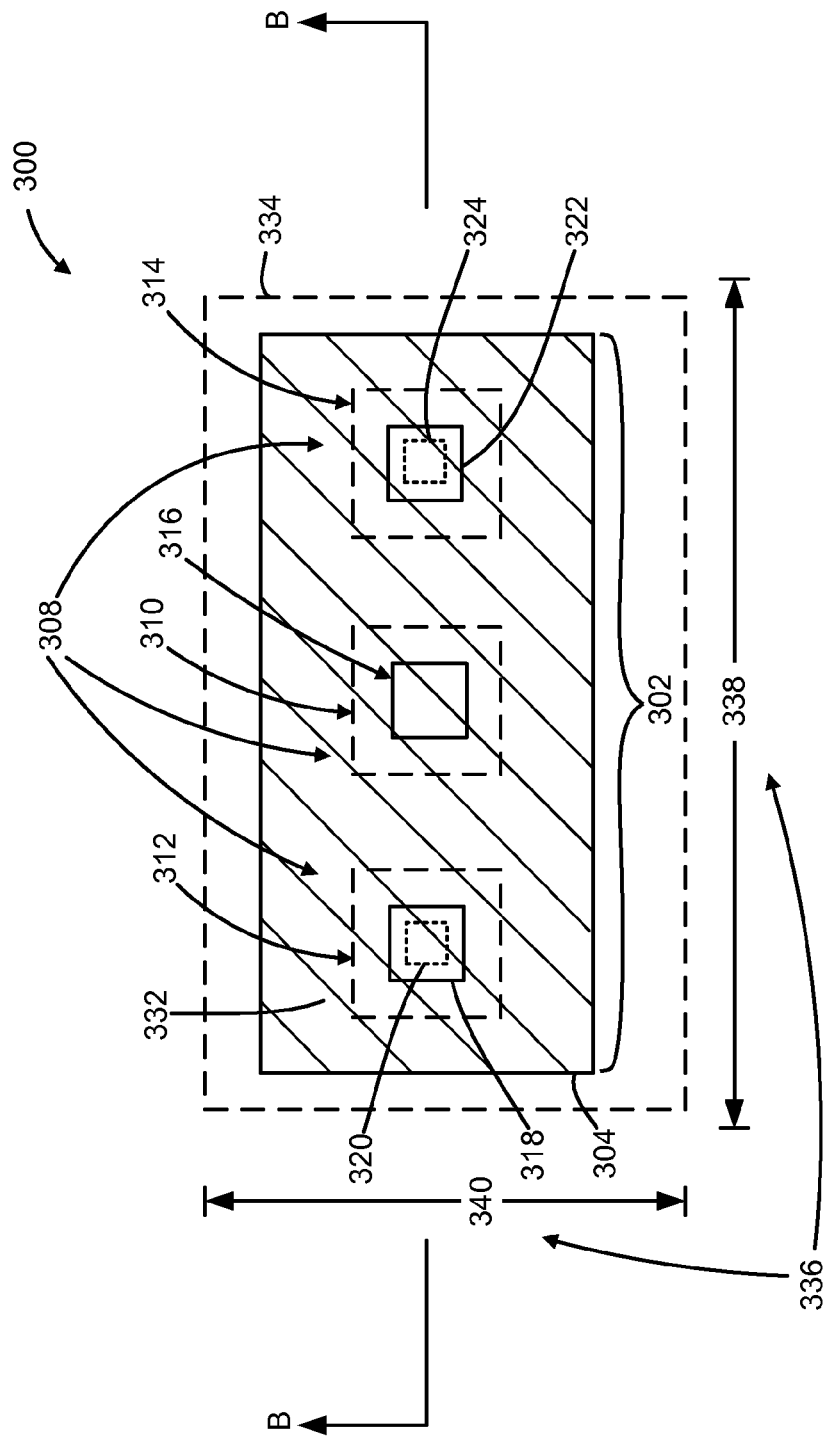
FIG. 6 is a plan view of another example of an image engine that is made in accordance with the concepts of the present invention.
Figure 7:
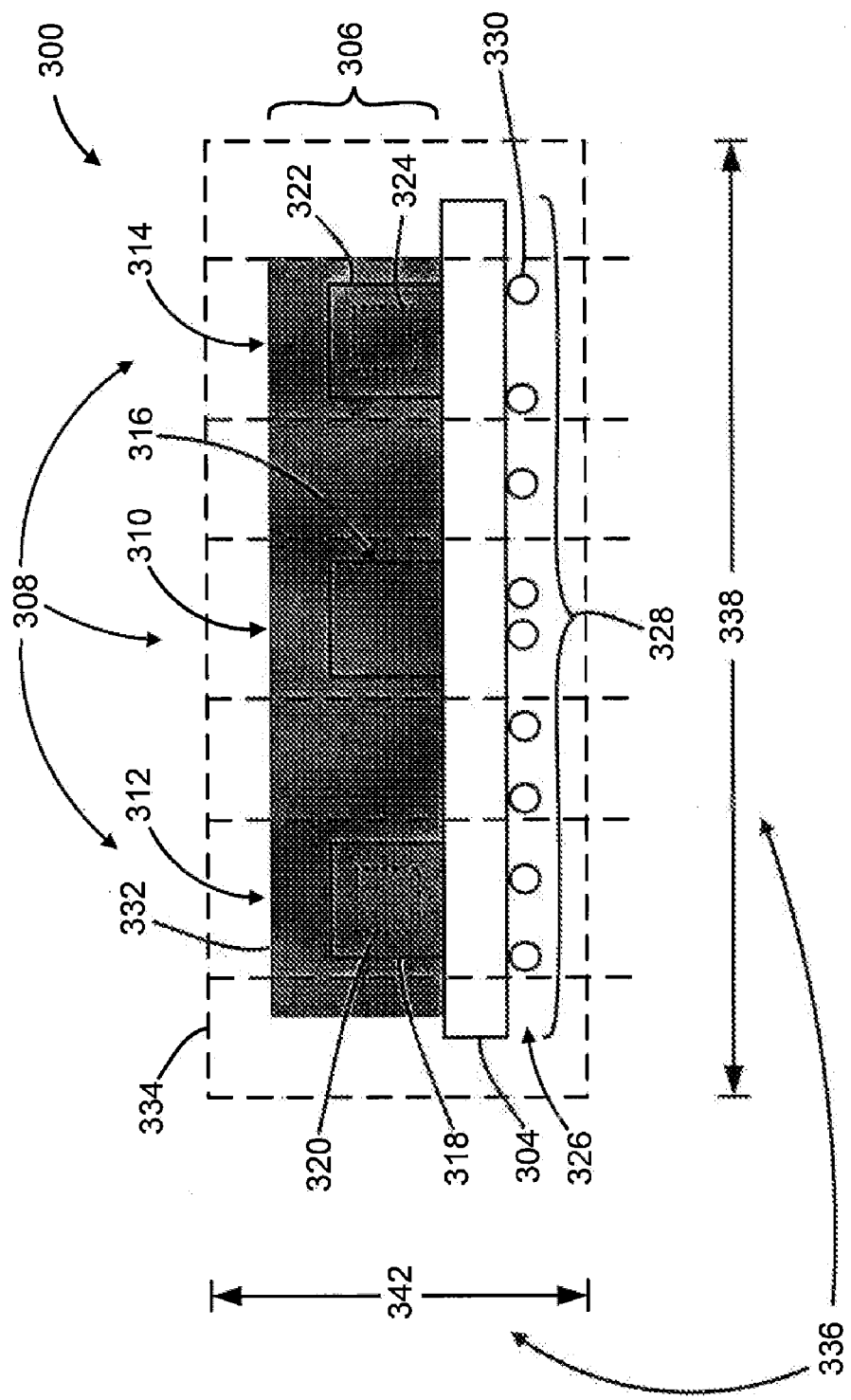
FIG. 7 is a front, cross-section view of the image engine of FIG. 6.

A first example of an image engine 300 according to such concepts is shown in the high-level schematic diagram of FIG. 6 and in side view in FIG. 7. Like numerals are used to identify like components as between FIGS. 4 and 5 and FIGS. 6 and 7, except that the numerals are increased (e.g., 100 in FIGS. 4 and 5 is 300 in FIGS. 6 and 7). Here it is seen that the image engine 300 with an IC structure 302 can comprise a substrate layer 304 for supporting materials layers and devices provided in accordance with the concepts of the present invention. In one embodiment, the image engine 300 can comprise a layered structure 306 disposed on the substrate layer 304, and which forms one or more active regions 308. The active regions 308 comprise an imaging region 310, an aiming region 312, and an illumination region 314. More particularly, it is shown in the example of FIGS. 6 and 7 that the substrate layer 304 can have disposed thereon an imaging module 316, an aiming pattern generating module 318 with an aiming light source 320, and an illumination module 322 with an illumination light source 324. The substrate layer 304 can comprise an input/output 326, and in one construction of the image engine 300 the input/output 326 can comprise a ball grid array 328 with a plurality of conductive terminals 330. The image engine 300 can also comprise an encapsulant layer 332 that can comprise materials such as epoxy that can protect the components of the image engine 300. As it is seen in the example of FIGS. 6 and 7, the image engine 300 can fit within a form factor 334, which can be defined by at least one dimension 336 such as an x-dimension 338, a y-dimension 340, and a z-dimension 342. The size of the image engine 300 can be accomplished by building material layers on the substrate layer 304. Materials that are selected for these material layers can be consistent with the operative characteristics of the components, construction, and operation of, e.g., the imaging module 316, the aiming pattern generating module 318, and the illumination module 322. Alternately the individual element for one or more of the functional elements and structures of the image engine 300 may be disposed on a carrier such as fiberglass PCB material, ceramic or equivalent substrate materials such as porcelain on steel.

Examining the various components of the image engine 300 in more detail, features of the aiming pattern generating module 318 are described next. These features are useful to provide an aiming pattern for optimizing the position of the image engine 300 with respect to the decodable indicia. To facilitate image acquisition, the aiming pattern generating module 318 can be operatively configured to project the aiming pattern in the form of a user-visible alignment indicator that assists in optimizing the spatial relationship between the image engine and the decodable indicia on the target. For example, using one or more light emitting devices, examples of which are provided immediately below, in conjunction with an appropriate optical system, the user may see patterns such as cross-hairs, corner brackets, one or more dots, a line, or combination of these, projected on the target bearing the decodable indicia. These patterns can provide visual feedback to the user to assist in placing the imaging module of the image engine 300 and the target indicia into an acceptable reading position relative to each other.

Although a variety of techniques can be used, in one example the aiming pattern generating module 318 can comprise one or more LEDs that are coupled to the substrate layer 304. These LEDs can be positioned so that the light generated by the LEDs is directed substantially perpendicular to the surface of the substrate layer 304 and away from the image engine 300. An opening or aperture can generally be provided in the encapsulant layer 332 so as to permit the light beam to exit the image engine 300. This aperture can be sized, shaped, and configured such as in the form of a slit, annular feature, square, rectangle, and a plurality of holes, all of which can influence the shape of the aiming pattern that is generated on the target.

In another example, the aiming pattern generating module 318 can also comprise a laser diode assembly. Laser diodes are generally conducive for use in image engines of the type described herein because such diodes can be manufactured using materials, and processes on the wafer-level scale. In one example, the laser diode often comprises one or more semiconductor materials with p-n junctions formed by doping layers of the semiconductor material to form n-type and p-type regions. An example of one laser diode that can be used in the image engine 300 is a vertical cavity surface emitting laser ("VCSEL"). These laser diodes can generate a sharp, crisp aiming pattern over a wide range of image engine to target distances. This range is often accomplished without the need for the shaped apertures and optics discussed in connection with the LEDs above. It will be appreciated of course that a suitable aperture in the encapsulant layer 332 is required to permit light from the laser diode assembly to exit the image engine and illuminate the target. The optical elements such as collimation lenses and or diffractive elements may need to be spaced apart from an active region and integrated onto the substrate. Examples of these diffractive elements are manufactured by Tessera of Charlotte, N.C.

Discussing now some features of the illumination light source 324, it is contemplated that the devices such as LEDs that are used as the illumination light source 324 are operatively configured to provide substantially uniform illumination of the target. In the case of acquisition illumination, the illumination light source 324 is projected towards the target, such as a bar code indicia on the target, and the resulting scattering light from the target passes through the optics of the image engine such as, for example, optics and optical layers position relative to the imaging module 316. The light can impinge on the responsive portion of the imaging module 316. As used herein, the term "light" means those electromagnetic wavelengths in the visible spectrum. While conventional data collection devices employ visible light, and primarily white, red, blue, and/or green for targeting and image acquisition illumination, this is not a requirement. That is, depending on the environment of use and overall module capabilities, other wavelengths or portions of the spectrum, both visible and invisible such as infrared and ultraviolet, may be used as well.

It is further noted that the amount of light, both ambient and that generated by the image engine 300, is an important factor in its performance. With regard to light generated by the image engine 300, the amount of light and the amount of power required to produce it are factors in whether an image can be acquired at all (for example, under low light and/or long range conditions); in the time needed to acquire the image (for example, higher illumination can improve contrast levels, decreasing the time needed to recognize and/or acquire an image); in the quality of the image acquired; in whether it is necessary or desirable to alternate or combine the use of aiming illumination and acquisition illumination sources; and, in the case of a battery-powered device, in balancing power conservation with performance. When reading 2D symbologies the aiming illumination is usually turned off when an image is being acquired in order to ensure a constant illumination over the field of view. This may also improve power conservation. When reading 1D bar code symbols or some 2D bar codes on the other hand, conditions such as low ambient lighting, relatively large distances, and relatively poor quality of the indicia may favor leaving the aiming illumination on when the acquisition illumination is energized, effectively turning the aiming illumination into an auxiliary form of acquisition illumination in order to maximize the light reaching the target indicia.

The uniform illumination from the illumination light source 324 may comprise, for example, an overall illuminated pattern that corresponds to the field of view of the imaging module 316. In one particular example, the illumination light source 324 is configured so that the overall pattern provided illuminates the corners of the field of view to a brightness of at least about 20% of the target areas maximum brightness. Randomization of the overall pattern such as by using a lens, lenses, lenticular lenses or microlenses can reduce the formation of "hot spots," which are concentrated areas of constant higher radiance illumination on the target area. Likewise diffusion of light in a direction generally transverse to the direction of light diffusion provided by, e.g., the microlenses, can cause the light rays to diverge in relation to one another at typical module to target reading distances (e.g., about 1 inch to 15 inches for common symbologies). Moreover, it will be appreciated that diffusion patterns of light generated by the illumination light source 324 can be substantially manipulated using various lensing techniques, which can be optimized and modified as desired to provide light coverage on the target. These modifications can be implemented as part of the manufacturing process, and/or as part of the construction of, e.g., the hand held device.

An important feature that is embodied in the image engine 300 of FIGS. 6 and 7 is that it consumes substantially less space in the x-dimension 338, the y-dimension 340, and the z-dimension 342. Each of these dimensions can be selected so that the resulting image engine 300 fits within and/or conforms to certain sizes of the form factor 334. In this connection, values for the dimensions can be selected so that the form factor 334 describes a three-dimensional space with a volume of less that about 500 mm$^3$. In one example, the volume is from about 200 mm$^3$ to about 300 mm$^3$, and still other configurations of the image engine 300 are contemplated wherein the volume is less than about 150 mm$^3$ as the Miniature image engines such as the image engine 300 as described herein will find increase use in battery operated devices including cordless bar code readers, PDAs, and cellular telephones. There is, therefore, increased motivation for making modules as energy efficient as is possible so as to increase the battery life of a battery which may be adapted to power the image engine 300. The inventors have addressed this problem by reducing the overall size of the image engine 300. It can be seen, for example, that developing the image engine 300 at the wafer-scale using semiconductor manufacturing techniques can reduce the space required in any one, and in most cases all, of these direction. Forming one or more of the aiming pattern generating module 318 and the illumination light source 324 as part of the layered structure of the semiconductor device can, for example, reduce the amount of space consumed in the z-dimension 342.

Another important feature that is embodied in the present example of the image engine 300 is that essentially all of the illumination elements, e.g., the aiming pattern generating module 318, and the illumination module 322, as well as the imaging module 316 are incorporated on the single, continuous substrate layer 304. Providing the single substrate 304 that carries in one embodiment the image sensor, the illumination LEDs, the laser diode as an integrated circuit package on the wafer scale virtually eliminates assembly, reduces material consumption, and thereby reduces the overall cost of producing the image engine module. Other embodiments that incorporate processing and memory functions, such as will be described in connection with FIGS. 8 and 9 below, can further be developed that include circuitry for processing signals generated by the image sensor, circuitry for capturing image data in the memory device, and circuitry for decoding and/or recognizing indicia represented in the captured image data.

Figure 8:
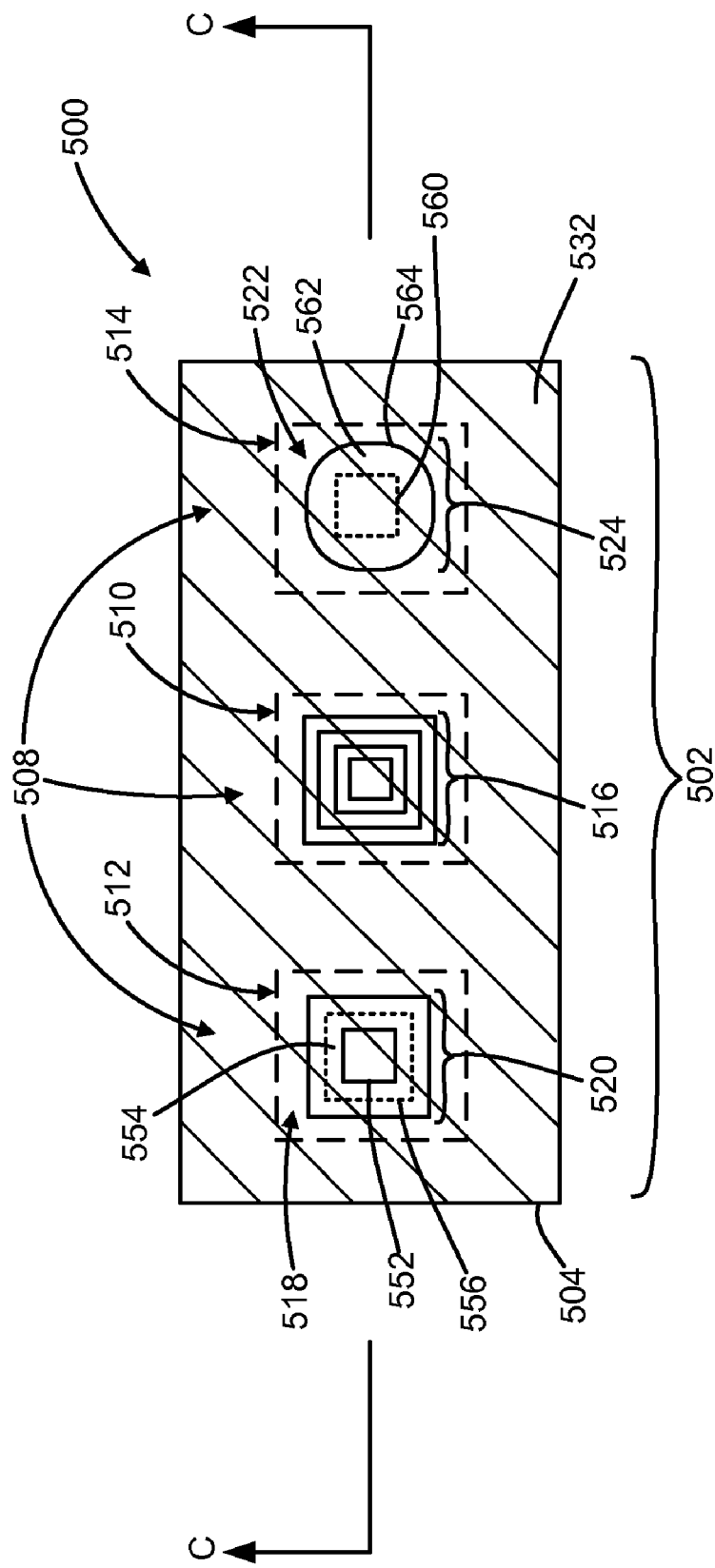
FIG. 8 is a plan view of yet another example of an image engine that is made in accordance with the concepts of the present invention.
Figure 9:
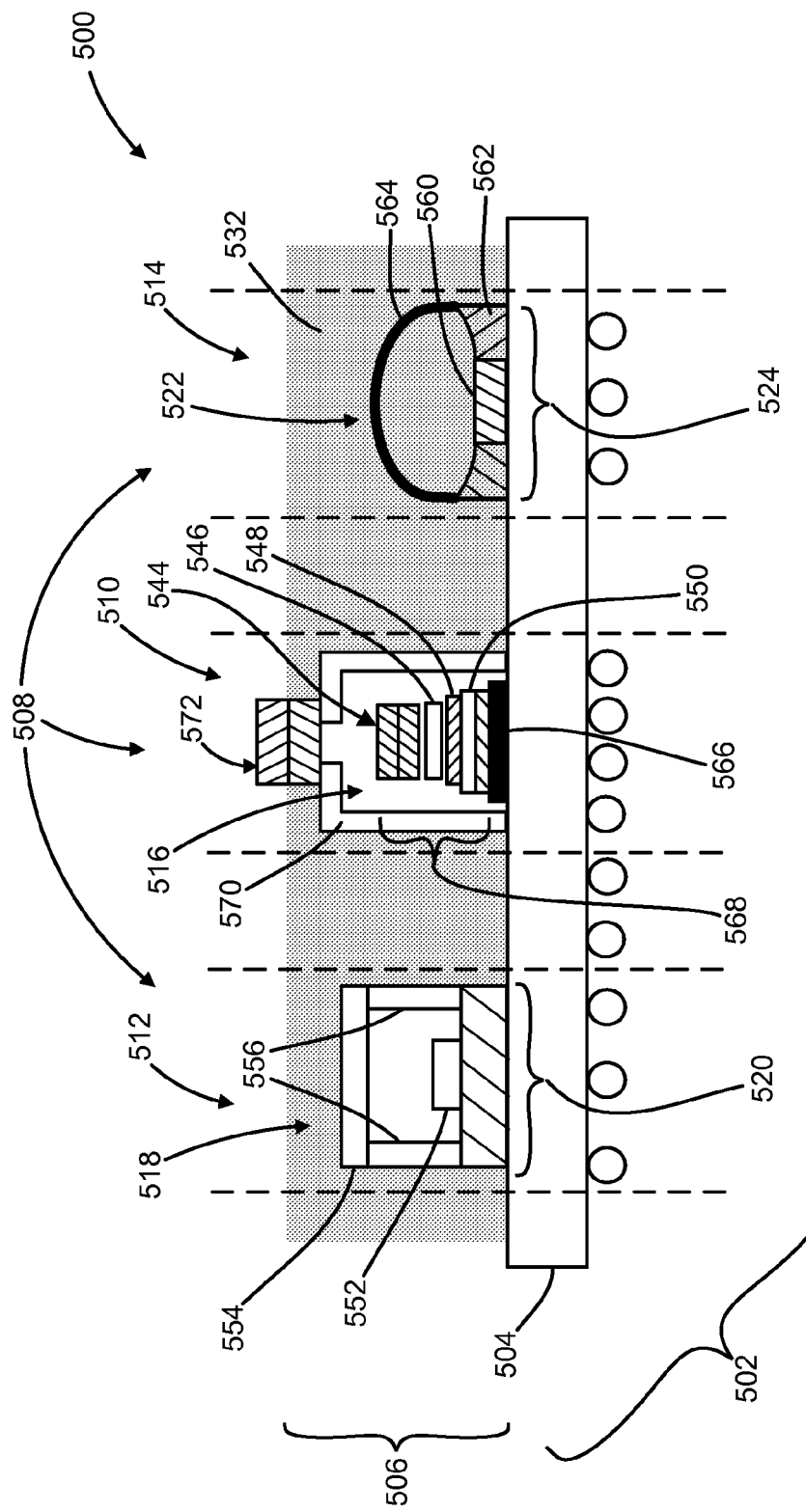
FIG. 9 is a front, cross-section view of the image engine of FIG. 8.

So with reference now to FIGS. 8 and 9, it is seen that another example of an image engine 500 is illustrated, which incorporates some of the concepts and features described above and disclosed herein Like numerals are also used herein to identify like components as between FIGS. 6 and 7 and FIGS. 8 and 9, except that the numerals are increased (e.g., 300 in FIGS. 6 and 7 is 500 in FIGS. 8 and 9). This example of the image engine 500 comprises in one embodiment an IC structure 502 with a substrate layer 504, a layered structure 506 disposed on the substrate layer 504. The image engine 500 also comprises one or more active regions 508 that include an imaging region 510, an aiming region 512, and an illumination region 514. The image engine 500 can further comprise an imaging module 516, an aiming pattern generating module 518 with an aiming light source 520, an illumination module 522 with an illumination light source 524, and an encapsulant layer 532 disposed in proximity to each.

As a more particular example of the concepts of the present invention, the imaging module 516 can comprise an imaging lens assembly 544, an image sensor 546, a processor 548, and a memory 550. The aiming light source 520 can have a laser diode 552, a patterning optical element 554, and a spacer 556 that separates the patterning optical element 554 from the laser diode 552. The illumination light source 524 can be constructed with at least one LED 560, a reflector 562, and a lens cap 564. Additional details for each of these components can be found above, as well as in the discussion that follows immediately below.

For example, it is seen that the imaging module 516 can also comprise an imaging sensor substrate 566 that can be used to support the components of the imaging module 516. This configuration can form a stacked imaging configuration 568, comprising one or more of the various components as a stand-alone unit or device that can be disposed on a corresponding portion of the substrate layer 504. Examples of such stand-alone units can comprise the 1/11-Inch Digital Image Sensor (Part No. MT9V113M02) manufactured by Aptina, of San Jose, Calif.; as well as the OptiML™ Wafer Level Camera manufactured by Tessera, of Charlotte, N.C. In more general terms, the processor 548 can be operatively configured to process signals from the image sensor 546, such as would be consistent with a CPU, ASIC, or other device for processing data Likewise the memory 550 can comprise RAM, read only memory ("ROM"), as well as other devices and structures that are configured to store data such as the raw and processed image data from the image sensor 546. The stacked imaging configuration 568 can be coupled to the substrate layer 504 using techniques that can include ball grid arrays, wire-bond, as well as other techniques suited for coupling, e.g., electrically coupling, the stacked imaging configuration 540 and the substrate layer 504. Moreover, one or more of the processor 548, memory 550, and suitable interface controller (not shown) for operating the image sensor 546 may be located external to the image engine 500.

Figure 10:
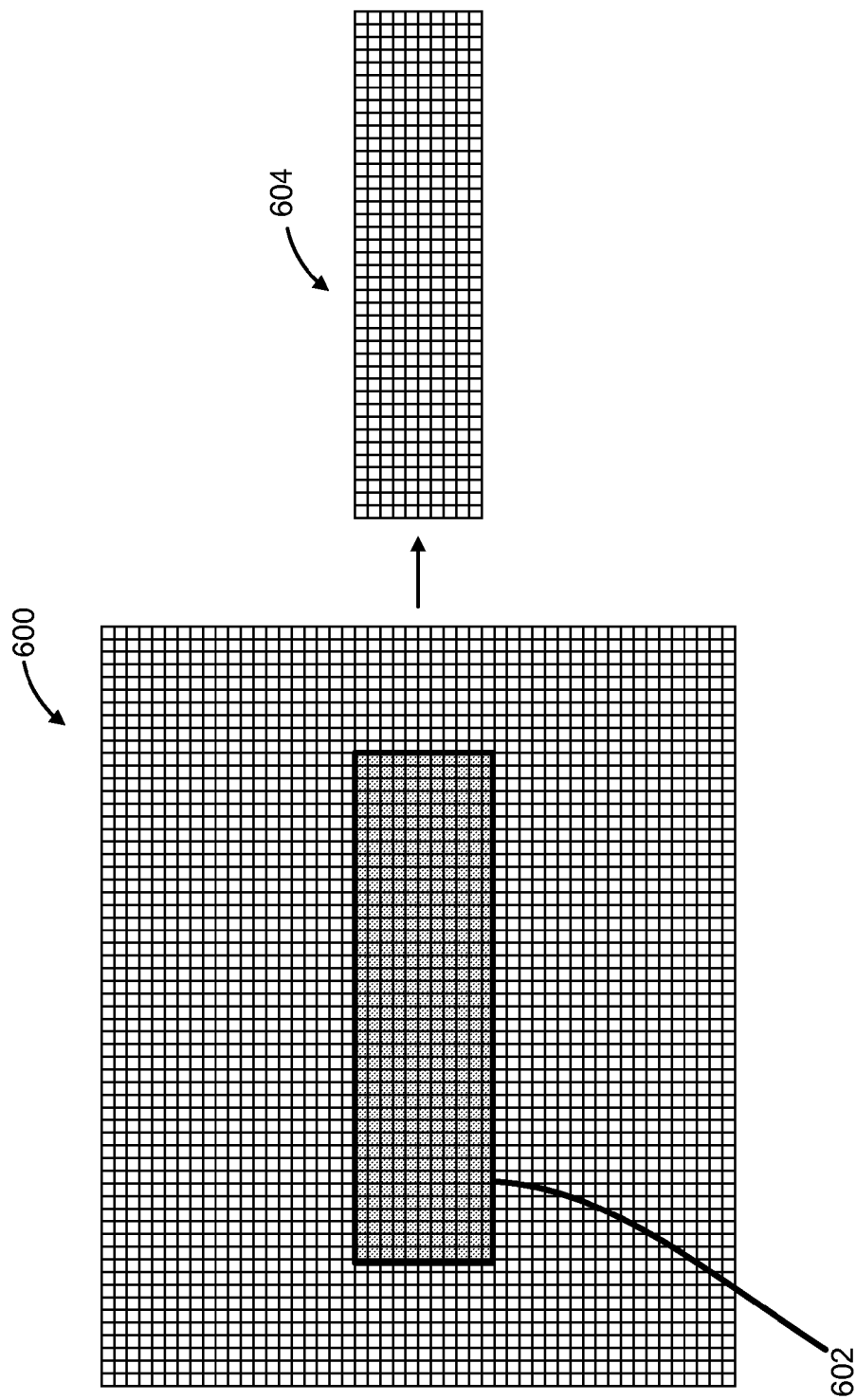
FIG. 10 is a diagram illustrating operations that can be performed by a windowing module of an indicia reading terminal.

Although not illustrated in detail herein, the image engine can comprise a windowing module, which can provide a windowed frame of image data. The windowing module can include a windowing circuit incorporated as part of the stacked imaging configuration 568. In response to commands received from CPU, the windowing circuit can selectively address for read out a subset of pixels of the image sensor array. A windowed frame is further described with reference to FIG. 10. Here it is seen that the image sensor array can include a plurality of pixels arranged in a plurality of rows and columns of pixels as shown in FIG. 10. The terminal can be operated to read out a full frame of image data from image sensor array. When reading out a full frame, the terminal reads out image data corresponding to all or substantially all pixels of image sensor array (e.g., from 80% to 100% of image sensory array). When reading out a windowed frame of image data, the terminal reads out image information corresponding to a subset of pixels of the image sensor array. In one example of a reading out of a windowed frame, the terminal reads out image information corresponding to less than 80% of pixels of the image sensor array. In another example of a reading out of a windowed frame, the terminal reads out image information corresponding to less than 50% of pixels of the image sensor array. In another example of a reading out of windowed frame, the terminal reads out image information corresponding to less than 1/3 of the pixels of image sensor array. In another example of a reading out of windowed frame, the terminal reads out image information corresponding to less than 25% of pixels of the image sensor array. In another example of a reading out of windowed frame, the terminal reads out image data corresponding to less than 10% of pixels of the image sensor array.

A particular example of a windowed frame read out is described with reference to FIG. 10. A windowed frame can comprise a continuous group of positionally adjacent pixel positions within a possible full frame 600 of pixel data. A continuous group of pixels can be provided where a group comprises each or essentially each pixel within a border defined by border pixels of a group. A group of pixels can also have a group of pixels including border pixels defining a border and skipped pixels within the border e.g., every other or every third pixel within the border can be skipped. Group of pixels 602 in the example of FIG. 10 are pixels of the image sensor array that are selectively addressed for read out of a windowed frame. The group of pixels 602 in the example of FIG. 10 is shown as including a continuous group of K×L, K>5, L>5 array of positionally adjacent pixels selectively addressed from the image sensor array having M×N pixels. A group of pixels for subjecting to read out of a windowed frame could also comprise a continuous group of K×1, L>5 array of pixels where the group of pixels are positionally adjacent such that each pixel position is positionally adjacent to at least one other pixel position of the group. The windowing circuit can be controlled to dynamically vary a window size between successive frames. It will be seen that a windowed frame at a certain terminal to target distance and lens setting can represent indicia within a defined area of a target substrate that is relatively smaller than a defined area within which indicia would be represented by a frame representing each pixel of the image sensor array.

When a windowed frame of image information is read out and stored in a memory in the form of digital image data, an image representation is provided having a number of pixel positions that is reduced relative to that of an image representation corresponding to a full frame 600. The windowed frame 604 of image data as illustrated in FIG. 10 has a number of pixel positions corresponding to the number of pixels of group of pixels 602 selectively addressed for read out of a windowed frame. It has been mentioned that image information read out from the image sensor array can be amplified by amplifier circuitry and then subject to conversion by analog to digital converter and then subject to storage into RAM. Stored image data stored into RAM can be in the form of multibit pixel values. Windowed frame 604 when stored in memory where it can be addressed for processing by CPU can comprise a plurality of pixel positions corresponding to the K×L array of pixels subject to selective addressing and selective read out, and each pixel position can have associated therewith a multibit pixel value representing light incident at the pixel having the corresponding pixel position of the image sensor array.

Windowed frame 604 can be captured in less time than a full frame 600. Accordingly, when the terminal switches from capture of a full frame to a windowed frame, a frame rate can increase and a frame time can decrease. As the number of pixel positions is reduced relative to that of a full frame 600, a memory overhead bandwidth for storage of windowed frame 604 can be reduced. Referring again to FIG. 10, it is seen that windowed frame 604 can still be of sufficient size to include a complete representation of decodable indicia where group of pixels 602 is at a center of an image sensor array as shown in FIG. 10, where decodable indicia is centered at a full frame field of view of the terminal and where indicia is at a sufficient distance from the terminal.

The terminal can capture frames of image data at a rate known as a frame rate. A typical frame rate is 60 frames per second (FPS) which translates to a frame time (frame period) of 16.6 ms. Another typical frame rate is 30 frames per second (FPS) which translates to a frame time (frame period) of 33.3 ms per frame.

Referring back to FIGS. 8 and 9, embodiments of the image engine 500 can further comprise a shroud 570 that is operatively constructed to optically isolate the imaging module 516 from the light sources, e.g., the laser diode 552, and the LED 560. The shroud 570 can be a mechanical feature that surrounds the imaging module 516 in a manner that prevents light that is not reflected by the target from impinging on the image sensor 546. The shroud 570 can also comprise material layers that are disposed in particular orientations during the manufacturing process so as to form a light barrier operatively configured to reduce exposure of the image sensor 546 to stray light from the light sources.

Suitable materials for use as the spacer 556 of the aiming pattern generating module 518 can include, but are not limited to, silicon, quartz, plastic, glass, and any suitable etched combinations thereof. The patterning optical element 554 can be constructed with certain optical properties that are useful to diffract light that emanates from the laser diode 552. These optical properties are generally selected to generate particular laser patterns such as a single point laser pattern that can illuminate the target, and is useful for aiming the image engine 500. In other embodiments, short focal length lens or lenses might also be use to generate an aiming pattern.

The reflector 562, which can be positioned in substantially annular surrounding relation to the LED 560, can be constructed of material with properties that reflect light. The shape and construction of the reflector 562 can concentrate light illuminating from the light source, e.g., the led 560, in a specific direction, which is generally substantially perpendicular to and away from the substrate layer 504. The lens cap 564 can be disposed in relation to the LED 560 (and the reflector 562) so that the lens cap 564 receives light from the LED 560. The lens cap 564 can be constructed of materials that do not interfere with the transmission of light from the light source, and in one particular construction of the image engine 500 that material of the lens cap 564 is selected, and shaped, so as to enhance the illuminating properties of the light source as the light impinges on the target.

The encapsulant layer 532 can be configured to protect the different components, and or regions of the image engine 500. The encapsulant layer 532 may be removed about aiming region 512 such as proximate the pattern generating module 518, and or about illumination region 514 such as proximate the illumination module 522 and or about image region 510 such as proximate the imaging module 516. Further, the encapsulant layer 532 may be colored such that it absorbs light and thereby reducing the stray light coupling into the image sensor 546.

In addition to the foregoing, in one embodiment the image engine 500 can further comprise one or more lensing layers 572, which are illustrated in the FIGS. 8 and 9 in exemplary form. The lensing layers 572 can be configured to augment one or more of the optical properties of the imaging module 516. In one example, the lensing layers 572 operate as one or more of the help lens(es) discussed above and contemplated herein This configuration can be manipulated by changing the material, material thickness, and the material shape of one or more of the lensing layers 572. For example, the material shape can comprise convex, and concave features and portions that are designed for their particular optical properties so that these optical properties can augment the depth of field of the imaging module 516. In other examples, multiple layers of the lensing layers 572 can be disposed in a substantially vertical organization above the imaging module 516 such as being disposed on the imaging lens assembly 544, the outer structure of the imaging module 516, and even the shroud 570. Amongst the lensing layers 572 can also be separation layers of material that can have no optical properties, or that are a selected so as to permit additional ones of the lensing layers 572 to be added to arrangement and configuration of the image engine 500.

Figure 11:
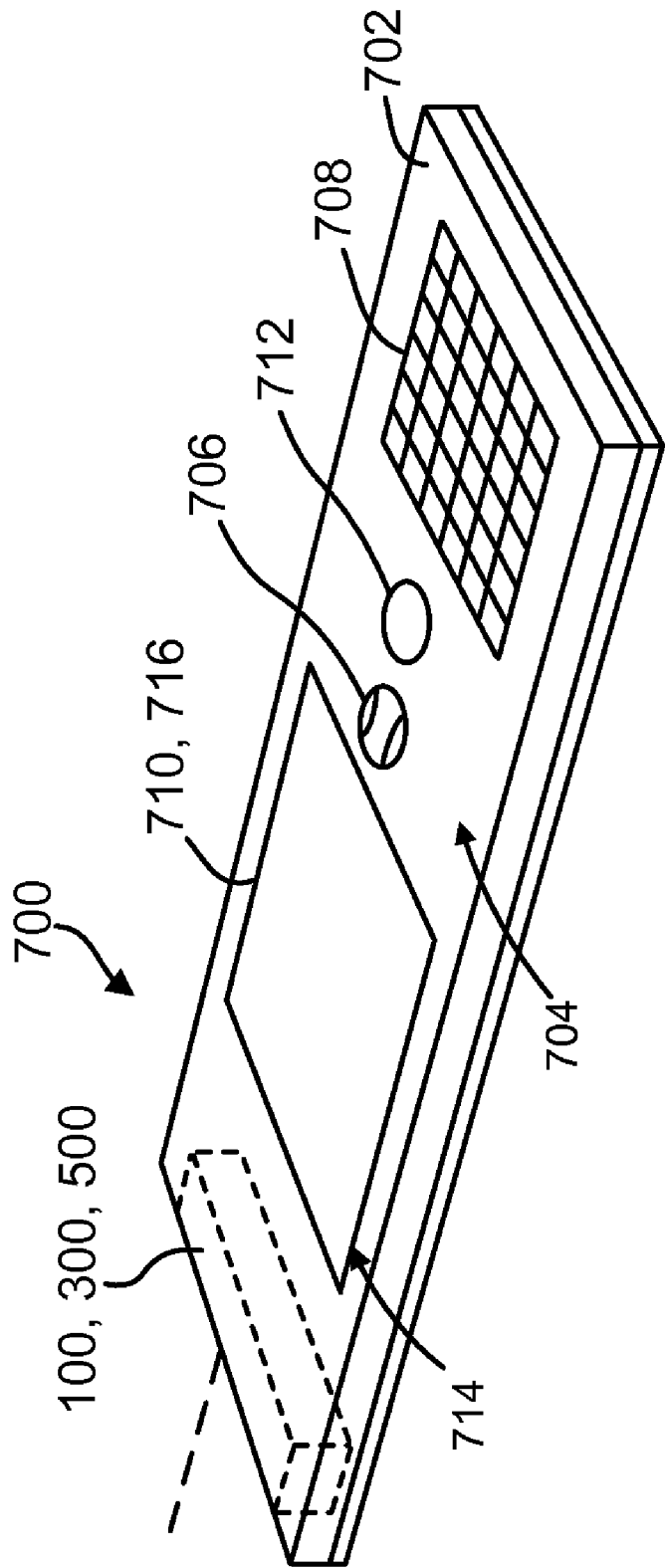
FIG. 11 is a perspective view of an indicia reading terminal incorporating an image engine such as the image engines of FIGS. 4-9.

Image engines 100, 300, 500 can be disposed and/or incorporated in an indicia reading terminal 700, an example of which is shown in FIG. 11. The indicia reading terminal 700 can include a hand held housing 702 that supports a user input interface 704 with a pointer controller 706, a keyboard 708, a touch panel 710, and a trigger 712. The hand held housing 702 can also support a user output interface 714 with a display 716.

Exemplary devices that can be used for devices of the user input interface 704 are generally discussed immediately below. Each of these is implemented as part of, and often integrated into the hand held housing 702 so as to permit an operator to input one or more operator initiated commands. These commands may specify, and/or activate certain functions of the indicia reading terminal. They may also initiate certain ones of the applications, drivers, and other executable instructions so as to cause the indicia reading terminal 700 to operate in an operating mode.

Devices that are used for the pointer controller 706 are generally configured so as to translate the operator initiated command into motion of a virtual pointer provided by a graphical user interface ("GUI") of the operating system of the indicia reading terminal 700. It can include devices such as a thumbwheel, a roller ball, and a touch pad. In some other configurations, the devices may also include a mouse, or other auxiliary device that is connected, e.g., via wire, or wireless communication technology, to the indicia reading terminal 700.

Implementation of the keyboard 708 can be provided using one or more buttons, which are presented to the operator on the hand held housing 702. The touch panel 710 may supplement, or replace the buttons of the keyboard 708. For example, one of the GUIs of the operating system may be configured to provide one or more virtual icons for display on, e.g., the display 716, or as part of another display device on, or connected to the indicia reading terminal 700. Such virtual icons (e.g., buttons, and slide bars) are configured so that the operator can select them, e.g., by pressing or selecting the virtual icon with a stylus (not shown) or a finger (not shown).

The virtual icons can also be used to implement the trigger 712. On the other hand, other devices for use as the trigger 712 may be supported within, or as part of the hand held housing 702. These include, but are not limited to, a button, a switch, or a similar type of actionable hardware that can be incorporated into the embodiments of the indicia reading terminal 700. These can be used to activate one or more of the devices of the portable data terminal, such as the bar code reader discussed below.

Displays of the type suited for use on the indicia reading terminal 700 are generally configured to display images, data, and GUIs associated with the operating system and/or software (and related applications) of the indicia reading terminal 700. The displays can include, but are not limited to, LCD displays, plasma displays, LED displays, among many others and combinations thereof. Although preferred construction of the indicia reading terminal 700 will include devices that display data (e.g., images, and text) in color, the display that is selected for the display 716 may also display this data in monochrome (e.g., black and white). It may also be desirable that the display 716 is configured to display the GUI, and in particular configurations of the indicia reading terminal 700 that display 716 may have an associated interactive overlay, like a touch screen overlay. This permits the display 716 to be used as part the GUI so as to permit the operator to interact with the virtual icons, the buttons, and other implements of the GUI to initiate the operator initiated commands, e.g., by pressing on the display 716 with the stylus (not shown) or finger (not shown).

The hand held housing 702 can be constructed so that it has a form, or "form factor" that can accommodate some, or all of the hardware and devices mentioned above, and discussed below. The form factor defines the overall configuration of the hand held housing 702. Suitable form factors that can be used for the hand held housing 702 include, but are not limited to, cell phones, mobile telephones, personal digital assistants ("PDA"), as well as other form factors that are sized and shaped to be held, cradled, and supported by the operator, e.g., in the operator's hand(s) as a gun-shaped device. One exemplary form factor is illustrated in the embodiment of the indicia reading terminal 700 that is illustrated in the present FIG. 8.

Figure 12:
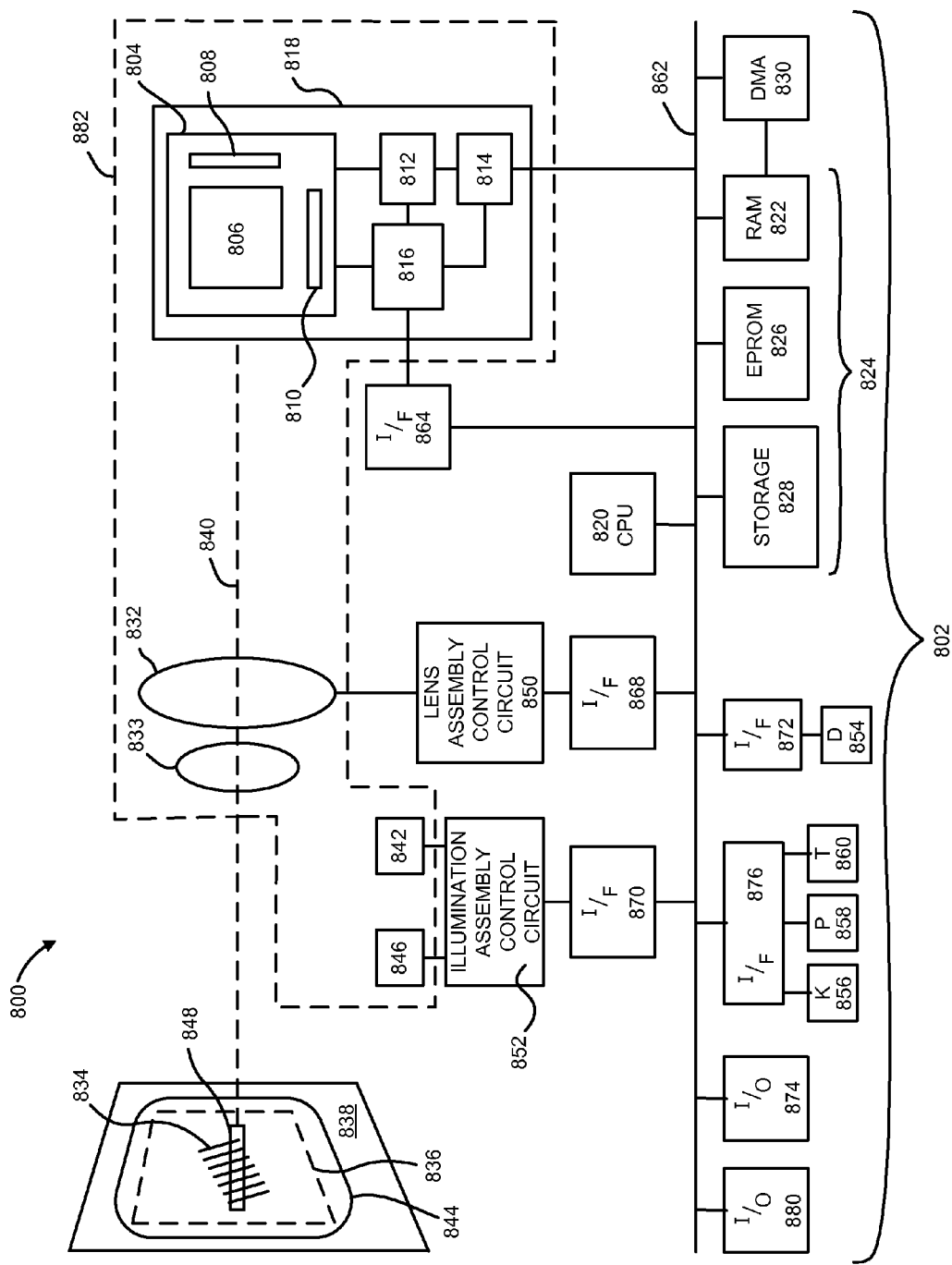
FIG. 12 is a block diagram of an exemplary hardware platform for implementation in an indicia reading terminal such as the indicia reading terminal of FIG. 11.

Turning next to FIG. 12, an exemplary embodiment of a hardware platform 800 is illustrated. At a relatively high level, configurations of the hardware platform 800 include one or more groups of electrical elements and circuitry that are each configured to operate separately, or in conjunction with other electrical circuits, to selectively capture and process images and image data. The hardware platform 800 and its components are configured to communicate amongst themselves and/or with other circuits (and/or devices), which execute high-level logic functions, algorithms, as well as firmware and software instructions. Exemplary circuits of this type include, but are not limited to, discrete elements such as resistors, transistors, diodes, switches, and capacitors, combinations of these discrete elements, as well as microprocessors and other logic devices such as field programmable gate arrays ("FPGAs") and application specific integrated circuits ("ASICs"). While all of the discrete elements, circuits, and devices function individually in a manner that is generally understood by those artisans that have ordinary skill in the electrical arts, it is their combination and integration into functional electrical groups and circuits that generally provide for the concepts that are disclosed and described herein.

In one example, the electrical circuits shown in the block diagram of the hardware platform 800 are configured to effectuate the operations and functions of indicia reading terminals such as the indicia reading terminal 700 of FIG. 11 above. Among its constituent components, the hardware platform 800 can include the image engine (e.g., the image engine 100, 300, 500) as a separate component that is coupled to one or more elements of the hardware platform 800. In another example, the electrical circuits, components, and/or related functions of the hardware platform 800 are incorporated together as part of an integrated circuit package, instantiating the IC structure (e.g., the IC structure 102, 302, 502) of the image engines (e.g., the image engine 100, 300, 500). This incorporation can occur by way of certain manufacturing techniques that are consistent with the scale and implementation of the concepts of the image engines described herein.

By way of example, it is seen in the block diagram that the hardware platform 800 can include circuitry 802, which can comprise any and all of the features provided in connection with the image engines 100, 300, 500 and indicia reading terminal 700 discussed above. These features include, but are not limited to, hardware for use as the active regions e.g., the active regions 108, 308, and 508, the configurations of which are discussed in detail above. In addition to these features, in one embodiment of the hardware platform 800, the circuitry 802 can comprise a peripheral imaging element 804 that can comprise a multiple pixel image sensor array 806 having pixels arranged in rows and columns of pixels, associated column circuitry 808 and row circuitry 810. The hardware platform 800 can further comprise amplifier circuitry 812, and an analog to digital converter 814 which in one example converts image information in the form of analog signals read out of image sensor array 806 into image information in the form of digital signals. Peripheral imaging element 804 can also have an associated timing and control circuit 816 for use in controlling, e.g., the exposure period of image sensor of the image engine 100, 300, 500, and peripheral imaging element 804, and/or gain applied to the amplifier circuitry 812. Many of the noted circuit components (e.g., peripheral imaging element 804, associated column circuitry 808, row circuitry 810, amplifier circuitry 812, and analog to digital converter 814) can be packaged into a common image sensor integrated circuit 818. In one example, an image sensor integrated circuit 818 can be provided by an MT10V022 image sensor integrated circuit available from Micron Technology, Inc. In another example, image sensor integrated circuit 818 can incorporate a Bayer pattern filter. In such an embodiment, CPU 820 prior to subjecting a frame to further processing can interpolate pixel values intermediate of green pixel values for development of a monochrome frame of image data. In other embodiments, red, and/or blue pixel values can be utilized for the image data.

In the course of operation of the hardware platform 800, image signals can be read out of the image engine 100, 300, 500, converted, and stored into a system memory such as RAM 822. A memory 824 of hardware platform 800 can include RAM 822, a nonvolatile memory such as EPROM 826, and a storage memory device 828 such as may be provided by a flash memory or a hard drive memory. In one embodiment, hardware platform 800 can include CPU 820 which can be adapted to read out image data stored in memory 824 and subject such image data to various image processing algorithms. Hardware platform 800 can include a direct memory access unit (DMA) 830 for routing image information read out from image engine 100, 300, 500 that has been subject to conversion to RAM 822. In another embodiment, hardware platform 800 can employ a system bus providing for bus arbitration mechanism (e.g., a PCI bus) thus eliminating the need for a central DMA controller. A skilled artisan would appreciate that other embodiments of the system bus architecture and/or direct memory access components providing for efficient data transfer among the components of the hardware platform 800, including among and between the image engine 100, 300, 500 and RAM 822 are within the scope and the spirit of the invention.

Referring to further aspects of hardware platform 800, hardware platform 800 can include an imaging lens assembly 832 (e.g., the imaging lens assembly 544 (FIG. 9)) and a help lens assembly 833 (e.g., lensing layers 572 (FIG. 9)) for focusing an image of a decodable indicia 834 located within a field of view 836 on a substrate 838 onto peripheral imaging element 804. Imaging light rays can be transmitted about an optical axis 840. Lens assemblies 832 and 833 can be adapted to be capable of multiple focal lengths and/or multiple best focus distances. These lengths and distances can, in some examples, be determined based on the optical properties and other characteristics of the peripheral imaging element 804. Particular to the help lens assembly 833, there is described and contemplated various configurations for use as the help lens assembly, such as described with respect to lensing layers 572 (FIG. 9). Alternately various techniques to vary the focus of lens and lens assembly such as those contemplated herein have been described that might be effectively utilized here to improve performance. Reference can be had for example to those variable focus techniques and related technology as described in one or more of U.S. Patent Application Publication Nos. 2007/0063048 filed by Havens et al. on Sep. 4, 2006, 2007/0080280 filed by Havens on Oct. 11, 2006, 2008/0144185 filed by Wang et al. on Aug. 31, 2007, and related patent applications allowing for a variable focus lens capability, each being incorporated by reference in its entirety herein.

Although the image engine 100, 300, 500 can include the illumination source, aiming source, and image sensor therein, some embodiments of the hardware platform 800 can also include an illumination pattern light source bank 842 for generating an illumination pattern 844 substantially corresponding to the field of view 836 of hardware platform 800, and an aiming pattern light source bank 846 for generating an aiming pattern 848 on substrate 838. In use, hardware platform 800 can be oriented by an operator with respect to a substrate 838 that has the decodable indicia 834 in such manner that aiming pattern 848 is projected on the decodable indicia 834. In the example of FIG. 12, the decodable indicia 834 is provided by a 1D bar code symbol. Decodable indicia could also be provided by 2D bar code symbols or optical character recognition (OCR) characters.

Each of illumination pattern light source bank 842 and aiming pattern light source bank 846 can include one or more light sources. Lens assembly 832 can be controlled with use of lens assembly control circuit 850 and the illumination assembly comprising illumination pattern light source bank 842 and aiming pattern light source bank 846 can be controlled with use of illumination assembly control circuit 852. Lens assembly control circuit 850 can send signals to lens assembly 832, e.g., for changing a focal length and/or a best focus distance of lens assembly 832. Illumination assembly control circuit 852 can send signals to illumination pattern light source bank 842, e.g., for changing a level of illumination output by illumination pattern light source bank 842.

Hardware platform 800 can also include a number of peripheral devices such as display 854 for displaying such information as image frames captured with use of hardware platform 800, keyboard 856, pointing device 858, and trigger 860 which may be used to make active signals for activating frame readout and/or certain decoding processes. Hardware platform 800 can be adapted so that activation of trigger 860 activates one such signal and initiates a decode attempt of the decodable indicia 834.

Hardware platform 800 can include various interface circuits for coupling several of the peripheral devices to system address/data bus (system bus) 862, for communication with CPU 820 also coupled to system bus 862. Hardware platform 800 can include interface circuit 864 for coupling image sensor timing and control circuit 816 to system bus 862, interface circuit 868 that couples the lens assembly control circuit 850 to system bus 862, interface circuit 870 that couples the illumination assembly control circuit 852 to system bus 862, interface circuit 872 that couples the display 854 to system bus 862, and interface circuit 876 that couples the keyboard 856, pointing device 858, and trigger 860 to system bus 862.

In a further aspect, hardware platform 800 can include one or more I/O interfaces 874, 880 for providing communication with external devices (e.g., a cash register server, a store server, an inventory facility server, a peer hardware platform, a local area network base station, a cellular base station). I/O interfaces 874, 880 can be interfaces of any combination of known computer interfaces, e.g., Ethernet (IEEE 802.3), USB, IEEE 802.11, Bluetooth, CDMA, and/or GSM.

In yet a further aspect, and as discussed above, any one or more of the elements of the hardware platform 800 can be included or incorporated into a single assembly (or integrated circuit package) to effectuate the construction of embodiments of the image engine 100, 300, 500. In one example, and as illustrated in FIG. 12, an image engine, generally demarcated as numeral 882, can comprise a number of the elements and circuitry of the hardware platform 800. While not illustrated as such, it is further contemplated the image engine 882 can likewise include the integration of CPU 820, memory (e.g., RAM 822, storage 828, and DMA 830) and EPROM 826 as well as other structures and circuitry otherwise compatible with the constructions described in the present disclosure. In still other embodiments, all of the components in the hardware configuration 800 can be incorporated into integrated circuit package to instantiate embodiments of the image engine 100, 300, 500 of the present disclosure.

By way of examples, and in still a further aspect, while the image engine 882 is depicted as including the illumination pattern light source bank 842 and the aiming pattern light source bank 846, the image engine 882 can have other configurations. In one configuration, the image engine 882 can comprise the illumination pattern light source bank 842, with the aiming pattern light source bank 846 being provided as part of the hardware platform 800 separately from the image engine 882. In another configuration, the image engine 882 comprises the aiming pattern light source bank 846, with the illumination pattern light source bank 842 being provided as part of the hardware platform 800 separately from the image engine 882. In yet another configuration, the image engine 882 does not include either the illumination pattern light source bank 842 or the aiming pattern light source bank 846. In still another configuration, each of the illumination pattern light source bank 842 or the aiming pattern light source bank 846 are provided as part of the hardware platform 800, separately from the image engine 882. Other configurations are also contemplated with the scope and spirit of the present disclosure that comprise devices and implements for generating light, including aiming and illumination lighting. Such devices and implements can be included and/or incorporated in one or more of the hardware platform 800 and the image engine 882, as well as other portions (e.g., circuitry) of the hand held terminals discussed herein.

It is contemplated that numerical values, as well as other values that are recited herein are modified by the term "about", whether expressly stated or inherently derived by the discussion of the present disclosure. As used herein, the term "about" defines the numerical boundaries of the modified values so as to include, but not be limited to, tolerances and values up to, and including the numerical value so modified. That is, numerical values can include the actual value that is expressly stated, as well as other values that are, or can be, the decimal, fractional, or other multiple of the actual value indicated, and/or described in the disclosure.

While the present invention has been particularly shown and described with reference to certain exemplary embodiments, it will be understood by one skilled in the art that various changes in detail may be effected therein without departing from the spirit and scope of the invention as defined by claims that can be supported by the written description and drawings. Further, where exemplary embodiments are described with reference to a certain number of elements it will be understood that the exemplary embodiments can be practiced utilizing either less than or more than the certain number of elements.

What is claimed is:

1. An integrated circuit package for imaging decodable indicia on a target, said integrated circuit package comprising:
   a first substrate comprising integrated circuitry having an input/output for conducting control and output signals;
   a second substrate coupled to the first substrate to conduct at least one output to the input/output;
   a camera module integrated with the second substrate, the camera module comprising an image sensor die and an integrated lens assembly through which light reflected from the target passes to the image sensor die; and
   an illumination module coupled to the first substrate, the illumination module comprising a first light source for directing a first light beam in the direction of the target; and
   a ball grid array disposed on the first substrate and forming the input/output, wherein the ball grid array is operatively configured with at least one terminal to conduct the signals to or from the integrated circuitry of the first substrate.

2. An integrated circuit package according to claim 1, wherein the first substrate comprises a printed circuit board.

3. An integrated circuit package according to claim 1, wherein the second substrate comprises one or more of silicon, silica, printed circuit board, and ceramic.

4. An integrated circuit package according to claim 1, further comprising a shroud disposed in surrounding relation to the camera module, wherein the shroud is configured to prevent light from the illumination module from impinging directly on the camera module.

5. An integrated circuit package according to claim 1, wherein the first substrate has a form factor in surrounding relation to each of the second substrate, the camera module, and the illumination module, and wherein the form factor has an area of less than about 500 mm$^2$.

6. An integrated circuit package according to claim 1, further comprising a second light source coupled to the first substrate, the second light source generating a second light beam.

7. An integrated circuit package according to claim 6, wherein the second light source comprises a light emitting device, an optical element for receiving the second light source, and a spacer separating the optical element from the light emitting device, and wherein the light emitting device comprises one or more of an LED die and a laser diode.

8. An integrated circuit package according to claim 1, wherein the first light source comprises an LED die and a reflector in surrounding relation to the LED die.

9. An integrated circuit package according to claim 1, further comprising a lens system for receiving light reflected from the decodable indicia before the camera module, wherein the lens system comprises at least one lens that is configured to increase a focal length of the camera module.

10. An integrated circuit package according to claim 9, further comprising an encapsulating layer disposed in surrounding relation to at least the camera module and the illumination module, wherein the encapsulating layer is configured to permit light reflected from the target to impinge on the lens system, and wherein the encapsulating layer is further configured to permit light emitted by the illumination module to illuminate the target.

11. A semiconductor chip package for use in a hand held indicia reading terminal for imaging decodable indicia on a target, said semiconductor chip package comprising:
   at least a first layer and a second layer, the first layer having a ball grid array disposed thereon and forming a first input/output,
   wherein the first layer comprises an illumination region that generates a first light beam in the direction of the target,
   wherein the second layer comprises an imaging region that comprises an image sensor die with an integrated lens assembly through which light reflected from the target passes to the image sensor die, and
   wherein the second layer has a second input/output coupled to the first layer in operative configuration to conduct an output from the image sensor die to the first input/output via the first layer.

12. A semiconductor chip package according to claim 11, further comprising a lens system configured to receive reflected light before the integrated lens assembly, and wherein the lens system comprises at least one lens that is configured to increase a focal length of the lens system.

13. A semiconductor chip package according to claim 11, wherein the illumination region generates a second light beam in the direction of the target.

14. A semiconductor chip package according to claim 13, further comprising:
   a first light source for generating the first light beam, the first light source comprising an LED die and a reflector in surrounding relation to the LED die and in combination configured to direct the first light beam towards the target; and
   a second light source for generating the second light beam, the second light source comprising a laser diode, an optical element for receiving the second light beam, and a spacer separating the optical element from the laser diode, and in combination configured to direct the second light beam towards the target,
   wherein at least one of the first light source and the second light source is located in the illumination region and coupled to the first layer.

15. A semiconductor chip package according to claim 11, further comprising a camera module combining the second layer, the image sensor die, and the integrated lens assembly, and wherein the camera module communicates with the first input/output via the second input/output.

16. A hand held indicia reading terminal for imaging decodable indicia on a target, said hand held indicia reading terminal comprising:
   an integrated circuit package for imaging the decodable indicia; and
   a hand held housing in surrounding relation to the integrated circuit package,
   wherein the integrated circuit package comprises,
   a first substrate that comprises an input/output for conducting control and output signals, and a ball grid array disposed on the first substrate and forming the input/output, wherein the ball grid array is operatively configured with at least one terminal to conduct the signals to or from integrated circuitry of the first substrate, and
   a camera module that comprises a second substrate coupled to the first substrate, a image sensor die disposed on the second substrate and which is responsive to light reflected from the target, and an integrated lens assembly through which light reflected from the target passes to the image sensor die, wherein the hand held housing is operatively configured to operate the integrated circuit package via the input/output so as to decode the decodable indicia.

17. A hand held indicia reading terminal according to claim 16, further comprising one or more of:
- a first light source coupled to the first substrate, the first light source comprising an LED die and a reflector in surrounding relation to the LED die, the reflector for directing a first light beam from the LED die towards the target; and
- a second light source coupled to the first substrate, the second light source comprising a light emitting device for generating a second light beam, an optical element for receiving the second light beam, and a spacer separating the optical element from the light emitting device, wherein the hand held housing is further operative to illuminate the target with one or more of the first light source and the second light source via the integrated circuit package, and wherein the light emitting device comprises one or more of an LED and a laser diode.

18. A hand held indicia reading terminal according to claim 17, further comprising a light shroud disposed in surrounding relation to the camera module to optically isolate the image sensor die from at least the first light beam.

19. A hand held indicia reading terminal according to claim 17, further comprising an encapsulating layer disposed in surrounding relation to at least the camera module, wherein the encapsulating layer is configured to permit light reflected from the target to impinge on the integrated lens assembly.

* * * * *